US008580591B2

(12) United States Patent
Peroni et al.

(10) Patent No.: US 8,580,591 B2
(45) Date of Patent: Nov. 12, 2013

(54) METHOD OF MANUFACTURING VERTICAL PIN DIODES

(75) Inventors: Marco Peroni, Rome (IT); Alessio Pantellini, Rome (IT)

(73) Assignee: Selex Sistemi Integrati S.p.A., Rome (IT)

( * ) Notice: Subject to any disclaimer, the term of this patent is extended or adjusted under 35 U.S.C. 154(b) by 71 days.

(21) Appl. No.: 13/171,053

(22) Filed: Jun. 28, 2011

(65) Prior Publication Data

US 2012/0001305 A1  Jan. 5, 2012

(30) Foreign Application Priority Data

Jun. 28, 2010 (IT) ............................. TO2010A0553

(51) Int. Cl.
*H01L 21/00* (2006.01)

(52) U.S. Cl.
USPC ............................. 438/39; 438/42; 438/689

(58) Field of Classification Search
USPC .............. 438/39, 42, 689; 257/656, E21.352, 257/E21.361
See application file for complete search history.

(56) References Cited

U.S. PATENT DOCUMENTS

| 5,213,994 A | 5/1993 | Fuchs |
| 2009/0000537 A1* | 1/2009 | Kurita ............................. 117/3 |

FOREIGN PATENT DOCUMENTS

FR  2559959 A1  8/1985

OTHER PUBLICATIONS

Seymour, David J., et al., "Monolithic MBE GaAs Pin Diode Limiter," Microwave and Millimeter-Wave Monolithic Circuits Symposium. Digest of Papers (Cat. No. 87CH2478-6), IEEE New York, NY (1987), pp. 35-37.
Italian Search Report in Italian Patent Application No. IT TO20100553, dated Feb. 7, 2011.

* cited by examiner

*Primary Examiner* — Kevin Parendo
(74) *Attorney, Agent, or Firm* — Marshall, Gerstein & Borun LLP

(57) ABSTRACT

The invention concerns a method of manufacturing a vertical PIN diode comprising: providing an epitaxial wafer comprising a vertically stacked N-type layer, intrinsic layer and P-type layer; forming an anode contact of the vertical PIN diode by forming an anode metallization on a first portion of the P-type layer defining an anode region; forming an electrically insulating layer around the anode region such that a first portion of the intrinsic layer extends vertically between the N-type layer and the anode region and second portions of the intrinsic layer extend vertically between the N-type layer and the electrically insulating layer; forming a trench in the electrically insulating layer and in the second portions of the intrinsic layer so as to expose a portion of the N-type layer defining a cathode region and to define a sacrificial side-guard ring consisting of a portion of the electrically insulating layer that extends laterally between the trench and the anode region and laterally surrounds said anode region; and forming a cathode contact of the vertical PIN diode by forming a cathode metallization on the exposed portion of the N-type layer defining the cathode region.

8 Claims, 7 Drawing Sheets

METHOD OF MANUFACTURING VERTICAL PIN DIODES

CROSS-REFERENCE TO RELATED APPLICATIONS

This application claims the benefit of Italian Patent Application NO. TO2010A 000553, filed Jun. 28, 2010.

TECHNICAL FIELD OF INVENTION

In general, the present invention relates to diodes that comprise a region of intrinsic semiconductor material, that is slightly doped or not doped at all, included between a region of P-type doped semiconductor material and a region of N-type doped semiconductor material and which are commonly called Positive-Intrinsic-Negative diodes or simply PIN diodes.

In particular, the present invention relates to a method of manufacturing vertical PIN diodes that finds advantageous, but not exclusive, application in the manufacture of Monolithic Microwave Integrated Circuits (MMICs).

STATE OF THE ART

As is known, Monolithic Microwave Integrated Circuits (MMICs) based on PIN diodes are widely used for manufacturing commutators, attenuators, frequency modulators, phase modulators, power limiters etc.

In general, according to the known art, a vertical PIN diode is made starting from a wafer of silicon (Si) or gallium arsenide (GaAs) or indium phosphide (InP) on which a layer of N-type doped semiconductor material, a layer of intrinsic semiconductor material I and a layer of P-type doped semiconductor material are deposited with an epitaxial growth technique, with the layer of intrinsic semiconductor material I interposed between the layer of N-type doped semiconductor material and the layer of P-type doped semiconductor material.

In particular, FIGS. 1-3 schematically show the cross-section of a vertical PIN diode manufactured according to a known manufacturing process.

In detail, in FIG. 1 reference numeral 10 indicates, as a whole, a vertical PIN diode comprising an epitaxial wafer made by means of the epitaxial growth technique, by depositing a sequence of layers on a wafer of semiconductor material, of GaAs for example, these layers comprising from the bottom to the top:

a semi-insulating substrate 11;
an $N^+$-type layer 12 formed on the semi-insulating substrate 11;
an intrinsic layer I 13 formed on the $N^+$-type layer 12; and
a $P^+$-type layer 14 formed on the intrinsic layer I 13.

Furthermore, always with reference to FIG. 1, in order to form an anode contact of the vertical PIN diode 10, an anode metallization 15 is formed on a portion of the $P^+$-type layer 14 defining an anode region 14a.

After having made the anode contact, a first trench is formed in the $P^+$-type layer 14 and in the intrinsic layer I 13 so as to expose the surface of portions of the $N^+$-type layer 12.

In particular, the first trench is formed by a first dry etching self-aligned with the anode metallization 15.

In detail, the first dry etching, even if an anisotropic etching, i.e. etching that mainly acts in a direction perpendicular to the upper surface of the epitaxial wafer, in any case also removes portions of the anode region 14a and of the intrinsic layer I 13 beneath the anode region 14a, despite them being protected by the anode metallization 15, so that, at the end of said first dry etching, portions of the anode metallization 15 extend laterally from the residual anode region 14a and from the residual intrinsic layer I 13 not removed by the first dry etching for an extent called Under-Cut (UC).

In addition, after performing the first dry etching, in order to form a cathode contact of the vertical PIN diode 10, a cathode metallization is formed on a first exposed portion of the $N^+$-type layer 12 defining a cathode region.

Lastly, in order to electrically insulate the vertical PIN diode 10 from other components created in the same MMIC, such as other PIN diodes and/or passive components such as capacitors, inductors and resistances, a second trench is formed in exposed portions of the conductive layers so as to expose portions of the underlying layers made with non-conductive semiconductor material.

In particular, the second trench is formed in a second exposed portion of the $N^+$-type layer 12, distinct from the cathode region, so as to expose the surface of underlying portions of the semi-insulating substrate 11.

In detail, the second trench is formed by a second dry etching.

Consequently, with reference to FIG. 2, after having made the second trench, the vertical PIN diode 10 comprises, from the bottom to the top:

the semi-insulating substrate 11;
the $N^+$-type layer 12 that partially covers the semi-insulating substrate 11 leaving exposed a portion of said semi-insulating substrate 11 that extends laterally from the $N^+$-type layer 12;
the residual intrinsic layer I 13 not removed by the first dry etching that partially covers the $N^+$-type layer 12 leaving exposed portions of said $N^+$-type layer 12 that extend laterally from the residual intrinsic layer I 13;
a cathode metallization 16 formed on a exposed portion of the $N^+$-type layer 12 defining the cathode region;
the residual anode region 14a not removed by the first dry etching that completely covers the residual intrinsic layer I 13; and
the anode metallization 15 that completely covers the residual anode region 14a and that comprises portions that extend laterally from the residual anode region 14a for an UC extent.

Furthermore, with reference to FIG. 3, in order to make an anode contact connection and a cathode contact connection, a first high-thickness metal air-bridge 17 is made in correspondence to the anode metallization 15 and a second high-thickness metal air-bridge 18 is made in correspondence to the cathode metallization 16.

The Applicant has noted, however, that the known manufacturing processes for vertical PIN diodes have several technical drawbacks.

In particular, the Applicant has noted that the first dry etching, especially when it has mainly anisotropic characteristics, i.e. when it mainly acts in direction perpendicular to the upper surface of the epitaxial wafer, induces mechanical damage and/or a residual deposit, particularly on the walls orthogonal to the etching direction, which causes damage on the surfaces of the semiconductor exposed to the plasma, in particular on those of the intrinsic layer I 13, and frequently cause high leakage currents when the vertical PIN diode is cut off, or rather when it is not polarized or inversely polarized, causing the following problems:

1) the conduction of current when the diode is cut off induces loss of insulation, at both low and high radio frequency signals (RF), also inducing a source of noise in the circuit where it is applied;

2) the flow of current through the diode, especially when it is inversely polarized at a high voltage, entails energy consumption by the diode, at the expense of the energy efficiency of the circuit itself; and 3) the currents induced by these surface effects can, in turn, lead to the creation of further defects, thereby inducing degradation that can affect the reliability of the circuit.

Moreover, when the reactive plasma used during the etching process is in the chemical-physical conditions to induce less damage to the semiconductor crystal it come into contact with, and which generally impose limits on its minimum pressure and its maximum acceleration energy, etching has a greater isotropic action, i.e. it also has a weak etching action on the semiconductor even in directions not parallel to that perpendicular to the upper surface of the epitaxial wafer. For this reason, namely in conditions of isotropic or partially isotropic etching, the first dry etching, in any case, also removes portions of the anode region 14a beneath the anode metallization 15, thereby causing lateral shrinkage of the area where the anode contact is formed, and this poses practical limitations in making diodes with low parasitic capacitances and resistances, where the limited minimum lateral dimensions associated with the high thicknesses of the intrinsic layer I 13 render the use of low-damage etching processes more critical. This problem is further exalted in the case where the anode contact connection is made through a high-thickness metal air-bridge, as in the situation shown in FIG. 3, due to the difficulties associated with the minimum lithographic resolution for making bridges with minimal contact areas.

Thus, based on what has just been described, the Applicant has reached the conclusion that the known manufacturing processes for vertical PIN diodes do not permit having accurate control over the width of the anode contact.

Known manufacturing processes for vertical PIN diodes that have the above-stated drawbacks are described in Seymour D. J. et al., "*MONOLITHIC MBE GaAs PIN DIODE LIMITER*", IEEE 1987 Microwave and Millimeter-Wave Monolithic Circuits Symposium, Digest of papers (Cat. No. 87CH2478-6) IEEE New York, N.Y., USA, 1987, pages 35-37, and in U.S. Pat. No. 5,213,994.

OBJECT AND SUMMARY OF THE INVENTION

The object of the present invention is therefore that of providing a method of manufacturing a vertical PIN diode that enables the previously described technical drawbacks of known manufacturing processes to be overcome, in particular that enables having accurate control over the width of the anode contact and that does not cause damage to the lateral surfaces of the intrinsic layer beneath the anode region.

The above-stated object is achieved by the present invention, which relates to a method of manufacturing a vertical PIN diode and to a vertical PIN diode, according to that defined in the appended claims.

In particular, the method of manufacturing a vertical PIN diode according to the present invention comprises:
providing an epitaxial substrate comprising a vertically stacked N-type layer, intrinsic layer and P-type layer; and
forming an anode contact of the vertical PIN diode by forming an anode metallization on a first portion of the P-type layer defining an anode region;
and is characterized by further comprising:
forming an electrically insulating layer around the anode region such that a first portion of the intrinsic layer extends vertically between the N-type layer and the anode region and second portions of the intrinsic layer extend vertically between the N-type layer and the electrically insulating layer;
forming a trench in the electrically insulating layer and in the second portions of the intrinsic layer so as to expose a portion of the N-type layer defining a cathode region and to define a sacrificial side-guard ring constituted by a portion of the electrically insulating layer that extends laterally between the trench and the anode region and laterally surrounds said anode region; and
forming a cathode contact of the vertical PIN diode by forming a cathode metallization on the exposed portion of the N-type layer defining the cathode region.

Preferably, the electrically insulating layer is formed by carrying out a ion implantation in a second portion of the P-type layer, which is distinct from the first portion of the P-type layer defining the anode region and which laterally surrounds said anode region.

In particular, the ion implantation is carried out by selectively implanting ions in the second portion of the P-type layer in order to make it electrically insulating. In this way, the electrically insulating layer is made in said second portion of the P-type layer in which the ions have been selectively implanted.

In detail, the ions selectively implanted in the second portion of the P-type layer damage a crystal lattice of the second portion of the P-type layer so as to make it electrically insulating.

Furthermore, the vertical PIN diode according to the present invention comprises:
an N-type layer;
a cathode contact formed on a first portion of the N-type layer defining a cathode region;
an intrinsic layer formed on a second portion of the N-type layer;
a portion of P-type layer formed on a first portion of the intrinsic layer and defining an anode region; and
an anode contact formed on the portion of P-type layer defining the anode region;
and is characterized by further comprising:
a protection structure formed on a second portion of the intrinsic layer to laterally protect the portion of P-type layer defining the anode region from an etching intended to expose the first portion of the N-type layer defining the cathode region.

Preferably, the protection structure has the shape of an electrically insulating sacrificial side-guard ring formed on the second portion of the intrinsic layer around the anode region to prevent said etching from etching the portion of P-type layer beneath the anode contact.

Advantageously, the electrically insulating sacrificial side-guard ring is made by implanting ions in a further portion of the P-type layer that laterally surrounds said portion of the P-type layer defining the anode region.

Preferably, the electrically insulating sacrificial side-guard ring is also formed around a sub-portion of the first portion of the intrinsic layer that extends beneath the anode region.

BRIEF DESCRIPTION OF DRAWINGS

For a better understanding of the present invention, some preferred embodiments, provided purely by way of non-limitative example, will now be illustrated with reference to the attached drawings (non to scale), where.

DETAILED DESCRIPTION OF PREFERRED EMBODIMENTS OF THE INVENTION

The present invention will now be described in detail with reference to the attached figures to enable an expert in the field to implement and use it. Various modifications to the embodiments described will be immediately obvious to experts and the generic principles described can be applied to other embodiments and applications without leaving the scope of protection of the present invention, as defined in the appended claims. Therefore, the present invention should not be considered as limited to the embodiments described and illustrated, but accorded the broadest scope of protection according to the principles and characteristics described and claimed herein.

FIGS. 4-12 schematically illustrate the cross-sections of a vertical PIN diode manufactured according to a preferred embodiment of the present invention.

Figure 4:
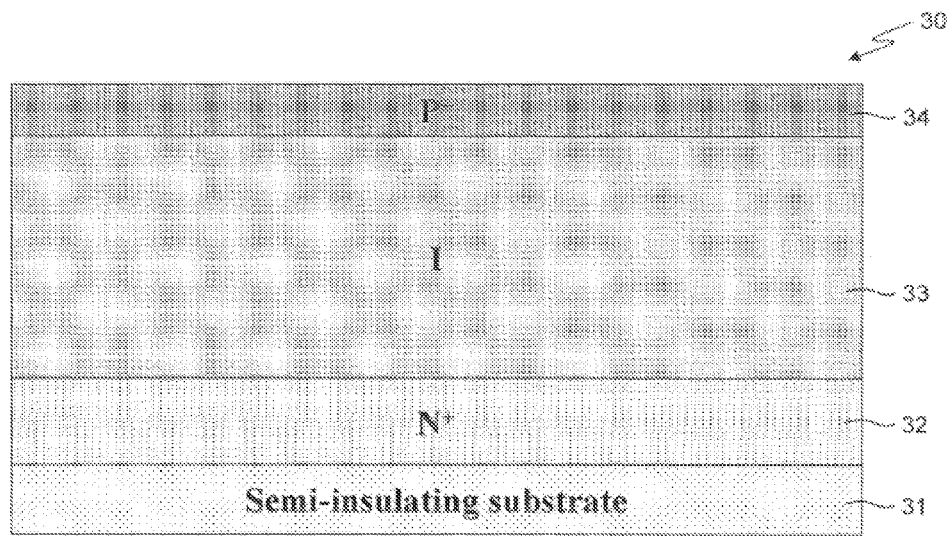
FIGS. 4-12 are schematic cross-sectional views of a vertical PIN diode manufactured according to a preferred embodiment of the present invention.

In particular, in FIG. 4 reference numeral 30 indicates, as a whole, a vertical PIN diode comprising an epitaxial wafer that, from the bottom to the top, comprises:

a semi-insulating substrate 31;
an N$^+$-type layer 32 formed on the semi-insulating substrate 31;
an intrinsic layer I 33 formed on the N$^+$-type layer 32; and
a P$^+$-type layer 34 formed on the intrinsic layer I 33.

Preferably, the epitaxial wafer is made using a wafer of gallium arsenide (GaAs) on which the N$^+$-type layer 32, the intrinsic layer I 33 and the P$^+$-type layer 34 are deposited by means of an epitaxial growth technique.

In particular,
the N$^+$-type layer 32 can be a layer of gallium arsenide (GaAs) doped with donor impurities (for example, Silicon (Si));
the intrinsic layer I 33 can be a layer of gallium arsenide (GaAs) not intentionally doped or doped with compensating impurities so as to provide said intrinsic layer I 33 with a concentration of charge carriers (electrons or holes) of less than $1 \times 10^{16}$ cm$^{-3}$; and
the P$^+$-type layer 34 can be a layer of gallium arsenide (GaAs) doped with acceptor impurities (for example, carbon (C) or beryllium (Be)) or a layer with forbidden band energy greater than GaAs, such as a layer of aluminium gallium arsenide (Al$_x$Ga$_{1-x}$As) for example, or indium gallium phosphide (In$_x$Ga$_{1-x}$P) doped with acceptor impurities (for example, carbon (C) or beryllium (Be)).

In an alternative embodiment, the epitaxial wafer can be made with a wafer of indium phosphide (InP) on which the N$^+$-type 32, intrinsic I 33 and P$^+$-type 34 layers can be made by depositing layers of semiconductor material such as InP, or lattice compounds adapted to the InP wafer, such as indium gallium arsenide phosphide (In$_{1-x}$Ga$_x$As$_y$P$_{1-y}$) or indium gallium aluminium phosphide (In$_{1-x}$Al$_x$As$_y$P$_{1-y}$).

In both embodiments, the epitaxial wafer can advantageously also include further non-intentionally doped "buffer" layers deposited on the semi-insulating substrate 31 before the N$^+$-type 32, intrinsic I 33 and P$^+$-type 34 layers in order to improve the characteristics of the crystal deposited by means of epitaxial growth. In this case, therefore, said buffer layers are interposed between the semi-insulating substrate 31 and the N$^+$-type layer 32.

Advantageously, the N$^+$-type layer 32, the intrinsic layer I 33 and the P$^+$-type layer 34 of the epitaxial wafer of the PIN diode 30 can have vertical thicknesses in μm, the compositions and concentrations of doping materials in cm$^{-3}$ and the types of doping indicated in the following table 1:

TABLE 1

| Layer | Vertical thickness (μm) | Composition | Doping material concentration (cm$^{-3}$) | Type of doping |
|---|---|---|---|---|
| 32 | 0.75 | GaAs | $1 \div 3e^{18}$ | N$^+$ |
| 33 | $1.0 \div 2.0$ | GaAs | $\leq 1e^{15}$ | N$^-$ |
| 34 | $0.2 \div 0.4$ | GaAs or Al$_{0.2}$Ga$_{0.8}$As | $3 \div 4e^{19}$ | P$^+$ |

Figure 5:
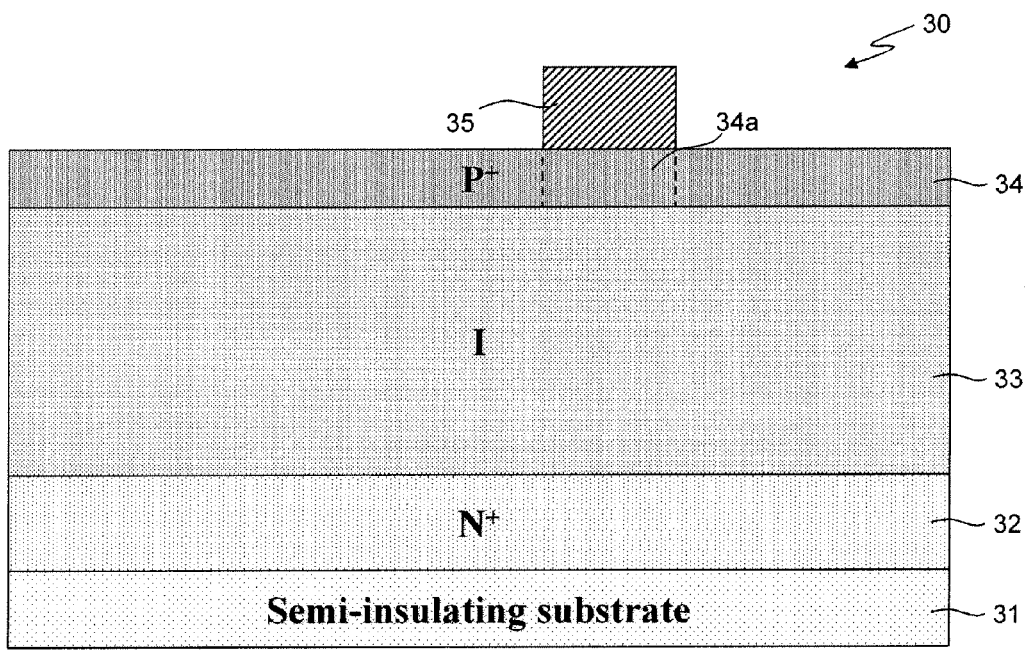

In addition, as shown in FIG. 5, in order to form an anode contact of the vertical PIN diode 30, an anode metallization 35 is formed on a first portion of the P$^+$-type layer 34 defining an anode region 34a.

In particular, in order to form the anode contact, a first mask (not shown in FIG. 5) is formed on the P$^+$-type layer 34 so as to leave only the anode region 34a exposed. The first mask can advantageously be formed by a layer of photoresist that is photolithographically patterned so as to form an aperture in correspondence to the anode region 34a. The anode metallization 35 can then be deposited through the aperture of the first mask on the anode region 34a.

Preferably, the anode metallization 35 comprises a layer of Platinum (Pt).

Advantageously, the anode metallization 35 can also comprise further metal barrier layers, for example Titanium (Ti) and Gold (Au), superimposed on the layer of Platinum (Pt).

Preferably, the PIN diode 30 is then subjected to a thermal cycle to bind the anode metallization 35 to the underlying anode region 34a, for example at 320° C. for 60 seconds.

Figure 6:
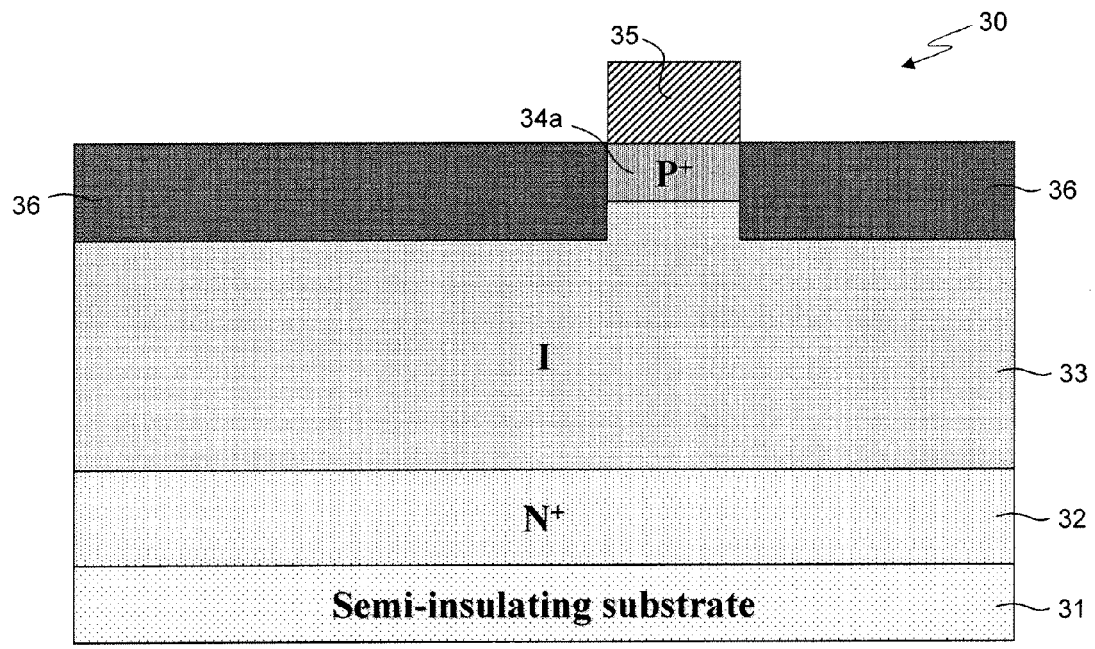

Subsequently, as shown in FIG. 6, an electrically insulating layer 36 is formed that laterally surrounds anode region 34a.

In particular, the electrically insulating layer 36 is formed by carrying out ion implantation in a second portion of the P$^+$-type layer 34, which is distinct from the first portion defining the anode region 34a and which laterally surrounds the anode region 34a so as to render said second portion of the P$^+$-type layer 34 electrically insulating.

In detail, the ion implantation is carried out in a manner so as to selectively implant ions in the second portion of the P$^+$-type layer 34 to make it electrically insulating and possibly, depending on the energy and doping used to carry out the ion implantation, also in a portion of the intrinsic layer I 33 that extends beneath the second portion of the P$^+$-type layer 34, without however reaching the N$^+$ 32 layer and consequently rendering it electrically insulating. The ions selectively implanted in the second portion of the P$^+$-type layer 34 cause damage to the crystal lattice of the second portion of the P$^+$-type layer 34 so as to render said second portion of the P$^+$-type layer 34 electrically insulating.

Preferably, the ion implantation is carried out self-aligned with the anode contact, or rather the ion implantation is made using the anode metallization 35 as a protective mask for the anode region 34a such that ions are only implanted in the second portion of the P$^+$-type layer 34, i.e. outside the anode region 34a.

In alternative to using the anode metallization 35 as a protective mask for the ion implantation, said ion implantation can be advantageously carried out by using a second mask (not shown in FIG. 6) formed on the vertical PIN diode 30 and such as to protect the anode region 34a from ion implantation, or rather to expose the second portion of the P+-type layer 34 to ion implantation.

In detail, the second mask can be advantageously formed by a layer of photoresist formed on the vertical PIN diode 30 and photolithographically patterned such as to expose the second portion of the P+-type layer 34 to ion implantation.

Advantageously, in the case where the P+ layer 34 has the vertical thicknesses, compositions and doping material concentrations indicated in Table 1, in order to electrically insulate the P+ layer 34 effectively, the ion implantation can be carried out by implanting Fluorine ion donors (F+) with an energy of 300 KeV and doping equal to $1e^{13}$ cm$^{-2}$.

With reference to FIG. 6 again, after the formation of the electrically insulating layer 36, the intrinsic layer I 33 comprises:
- a first portion that extends vertically between the N+-type layer 32 and the anode region 34a; and
- second portions that extend vertically between the N+-type layer 32 and the electrically insulating layer 36.

Subsequently, a first trench is formed in the electrically insulating layer 36 and in the intrinsic layer I 33 so as to expose a portion of the N+-type layer 32 defining a cathode region and to define a sacrificial side-guard ring constituted by a portion of the electrically insulating layer 36 that extends laterally between the first trench and the anode region 34a and laterally surrounds said anode region 34a.

Figure 7:
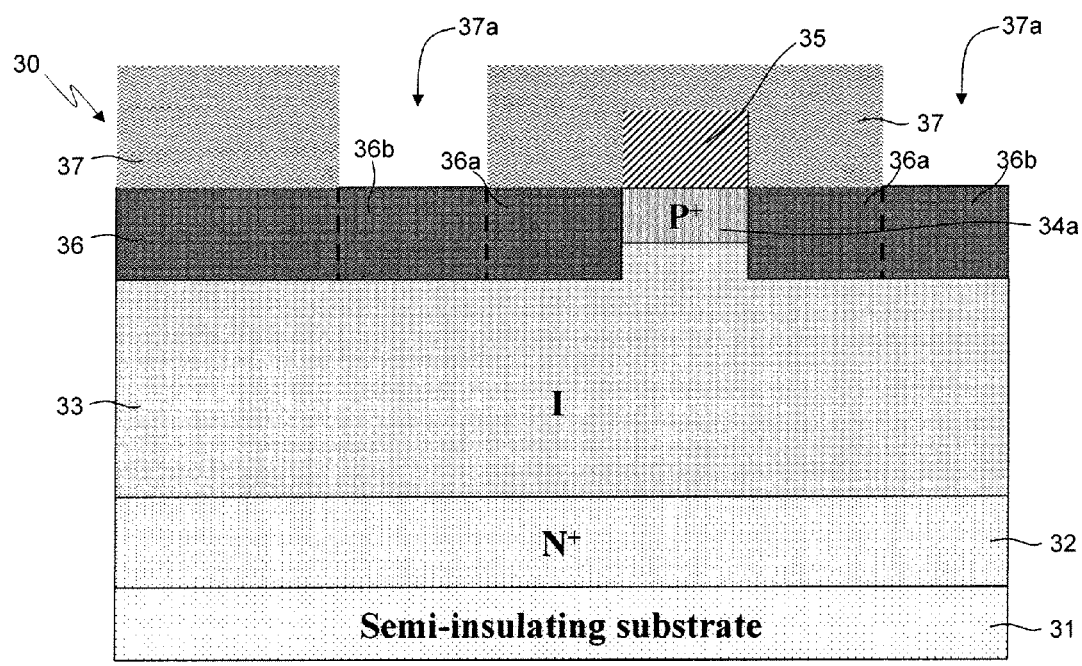

In particular, as shown in FIG. 7, in order to make the first trench, a third mask 37 is formed on the vertical PIN diode 30 that covers at least a first portion 36a of the electrically insulating layer 36 defining the sacrificial side-guard ring and that leaves a second portion 36b of the electrically insulating layer 36 exposed that extends laterally from the first portion 36a and laterally surrounds said first portion 36a.

In detail, the first portion 36a of the electrically insulating layer 36 extends laterally between the second portion 36b of the electrically insulating layer 36 and the anode region 34a and laterally surrounds said anode region 34a.

Advantageously, the third mask 37 can be formed by a layer of photoresist that is photolithographically patterned so as to form an aperture 37a in correspondence to the second portion 36b of the electrically insulating layer 36.

Figure 8:
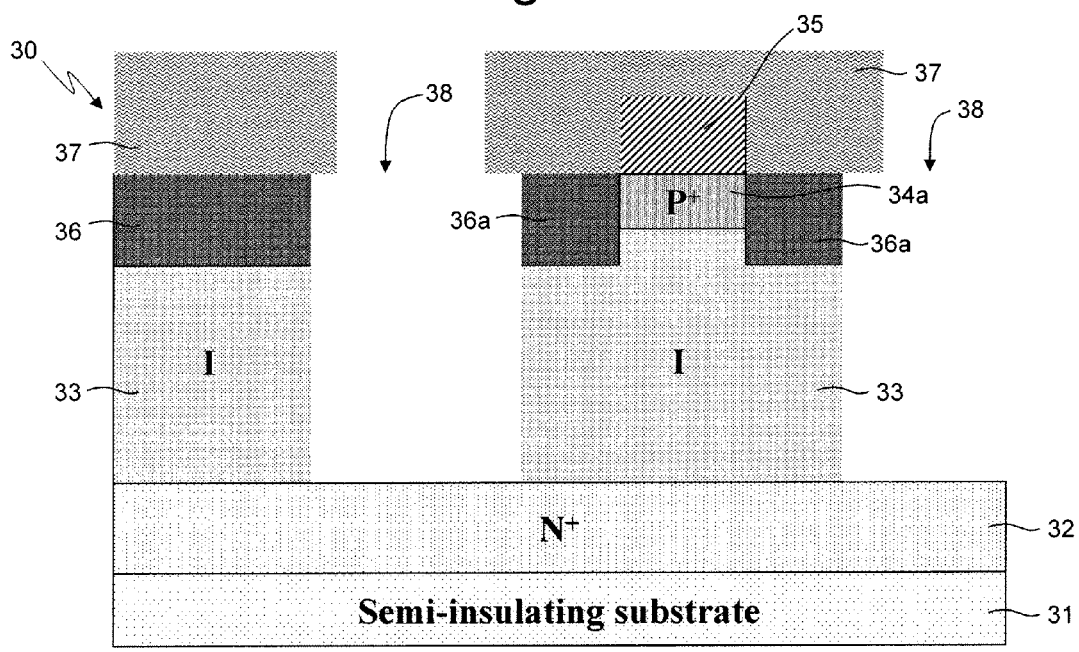

Then, as shown in FIG. 8, a first trench 38 is formed by selectively removing, the second portion 36b of the electrically insulating layer 36 left exposed by the third mask 37 and the second portions of the intrinsic layer I 33 that extend beneath said second portion 36b of the electrically insulating layer 36, by means of a first etching, preferably wet to minimize damage to the surface of the intrinsic layer I 33, so as to expose a portion of the N+-type layer 32 defining the cathode region.

In particular, the first trench 38 laterally surrounds the sacrificial side-guard ring 36a and the intrinsic layer I 33 that has not been removed by the first etching and that extends vertically between the N+-type layer 32 and the anode region 34a and the sacrificial side-guard ring 36a; the cathode region is laterally and vertically spaced apart from the anode region 34a and from the intrinsic layer I 33 that has not been removed by the first etching and that extends vertically between the N+-type layer 32 and the anode region 34a and the sacrificial side-guard ring 36a.

Figure 2:
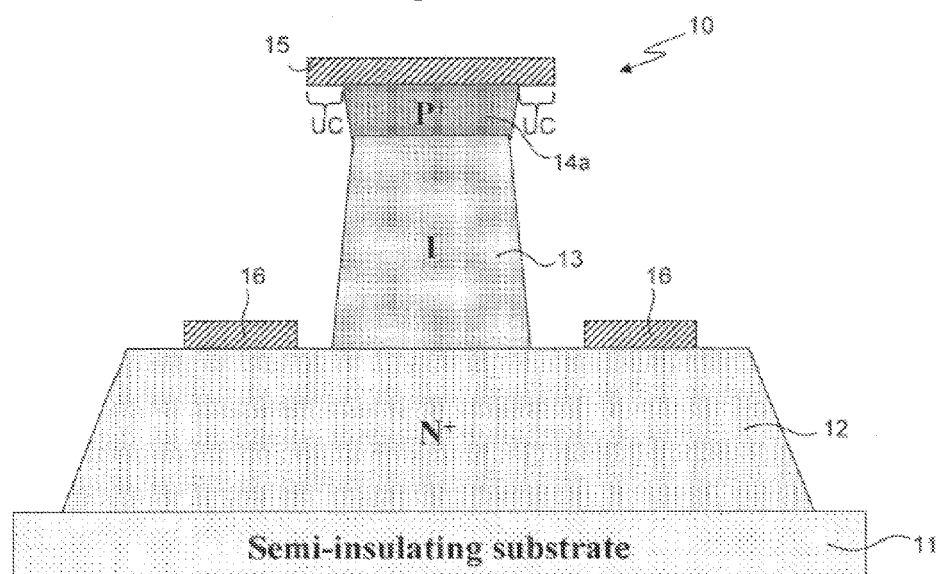
Figure 3:
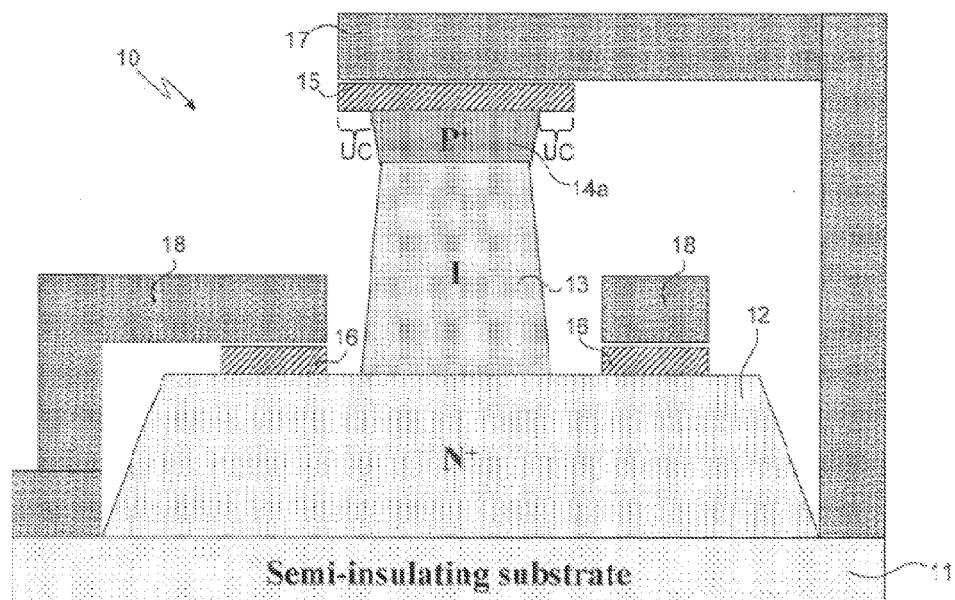

As shown in FIG. 8, the sacrificial side-guard ring 36a laterally protects the anode region 34a from the first etching for making the cathode contact, as the area of the anode contact is defined by the anode region 34a by means of the electrical insulating process of layer 36, and not by the area of the anode contact from which a crown of UC breadth is subtracted, equal to the under-etching due to the isotropic contribution of the etching, as in the case of the known art illustrated in FIG. 2.

In other words, always as shown in FIG. 8, the first etching for creating the cathode contact made using the third mask 37, even though removing lateral portions of the sacrificial side-guard ring 36a that extend beneath the third mask 37, is in any case unable to eat into the anode region 34a thanks precisely to the protection guaranteed by said sacrificial side-guard ring 36a and, consequently, unable to laterally shrink the electrically active area of the anode contact. In particular, the side-guard ring 36a is called sacrificial precisely because its lateral portions are sacrificed to protect the anode region 34a from the first etching. In other words, the sacrificial side-guard ring 36a is a protection structure that serves to laterally protect the anode region from the first etching.

In addition, the greater distance of the electrically active area from the walls of the first trench 38 has the further technical advantage that the electrical path of the PN junction at its weakest point (in correspondence to the GaAs surface, where electron "trap" states are usually present that act as recombination and/or generation centres for electron-hole pairs) can be significantly greater than the distance between doped layers, such as in the case obtained with the known art, as it is actually "lengthened" by the width of the insulating GaAs layer present between the anode and cathode contacts, i.e. by the breadth of sacrificial side-guard ring 36a that surrounds the anode region 34a. This characteristic ensures that the vertical PIN diodes made according to the present invention have, for the same diode polarization voltage, a smaller on average electric field in correspondence to the surfaces. This results in having a smaller injection of minority carriers on the surface and therefore a lower charge recombination rate through the traps present on it, with consequently smaller leakage current through the surface, both when the diode is in the cut off state and when it is switched on. For the same reason, the presence of the sacrificial side-guard ring 36a can contribute to increasing the breakdown voltage, which limits the capacity of the PIN diodes to operate in the OFF state under a high-power radiofrequency (RF) signal.

Returning now to the detailed description of the preferred embodiment of the present invention, after having formed the first trench 38, a cathode contact of the vertical PIN diode 30 is formed on the exposed portion of the N+-type layer 32 defining the cathode region.

Figure 9:
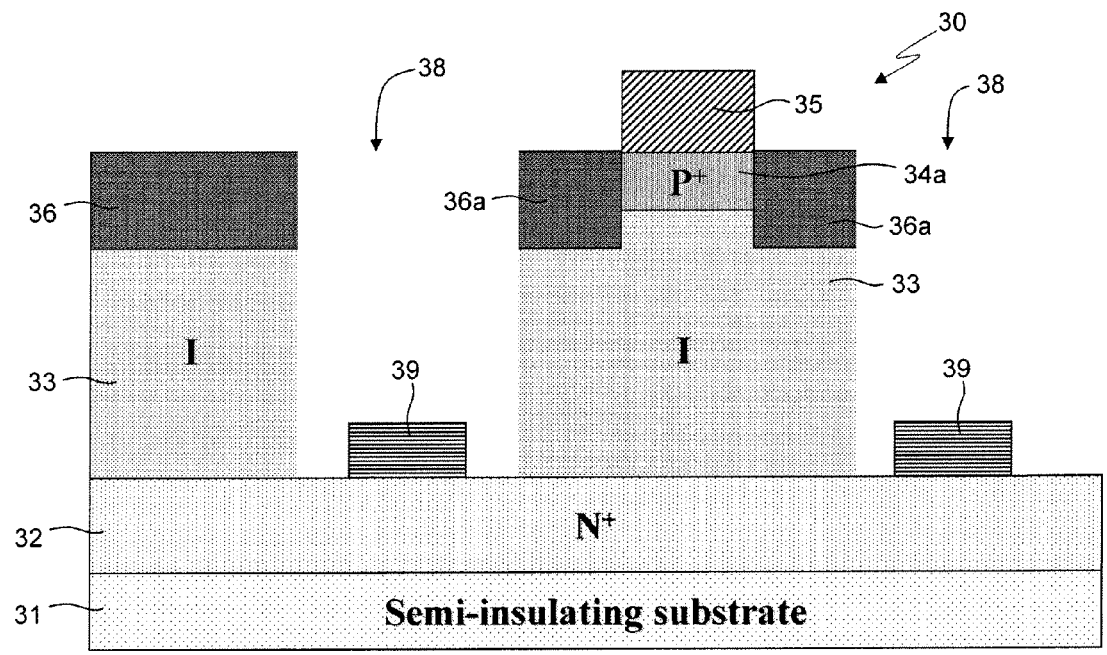

In particular, as shown in FIG. 9, in order to form the cathode contact of the vertical PIN diode 30, a cathode metallization 39 is formed on the exposed portion of the N+-type layer 32 defining the cathode region.

Advantageously, the cathode metallization 39 can be deposited on the cathode region through the aperture 37a of the third mask 37 and through the first trench 38.

Advantageously, the cathode metallization 39 can comprise layers of Gold (Au), Germanium (Ge) and Nickel (Ni).

Preferably, the vertical PIN diode 30 is then subjected to a thermal cycle to bind the cathode metallization 39 to the underlying cathode region, for example 390° C. for 60 seconds.

Figure 10:
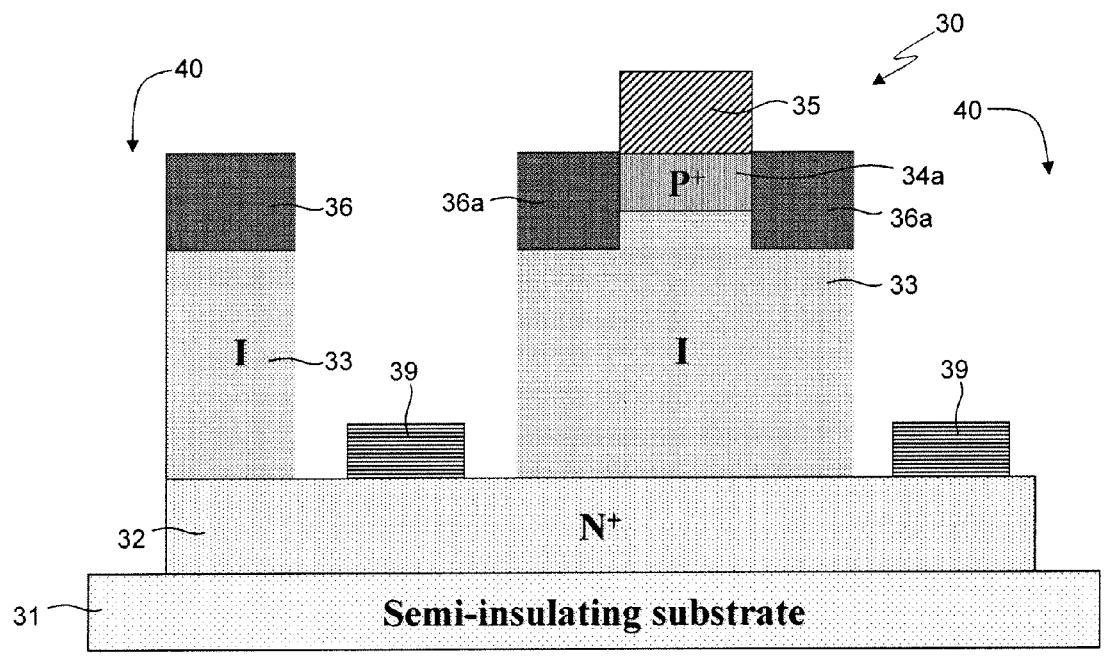

Subsequently, as shown in FIG. 10, in order to insulate the vertical PIN diode 30, a second vertical trench 40 is formed so as to expose the surface of the semi-insulating substrate 31 and so surround the PIN diode 30, electrically insulating it from other components and/or devices present on the surface of a same MMIC. The second vertical trench 40 is laterally spaced apart from the first trench 38, from the anode region 34a and from the intrinsic layer I 33 that has not been removed by the first etching and that extends vertically between the N⁺-type layer 32 and the anode region 34a and the sacrificial side-guard ring 36a.

In particular, the second trench 40 is formed by selectively removing, by means of a second etching, called insulation etching, specific portions of the N⁺-type conductive layer 32 that extend over the semi-insulating substrate 31 externally to the anode and cathode contacts of the vertical PIN diode 30, in order to obtained the desired electrical insulation between the vertical PIN diode 30 and the other components of the same MMIC.

Advantageously, in order to insulate the vertical PIN diode 30 and, consequently, to create the second trench 40, a fourth mask (not shown in FIG. 10) can be used after being formed on the vertical PIN diode 30, formed for example by a patterned photoresist layer so as to leave portions of the N⁺-type 32 and I-type 33 layers and the electrically insulating layer 36 external to the anode and cathode contacts exposed to insulation etching.

Alternatively, the process of forming the cathode contact and the subsequent insulation of the N⁺ layer 32 can take place by:

carrying out etching that removes the electrically insulating layer 36 and the intrinsic layer I 33 in all the surface of the epitaxial wafer, except for the areas of the electrically insulating layer 36 around the anode contact protected by opportune masks patterned around them, until the surface of the N⁺-type layer 32 is exposed;

forming a further mask to deposit the cathode metallization 39 and performing the thermal binding cycle, as previously described; and forming a further mask to protect the anode and cathode contacts and removing the specific portions of the N⁺-type layer 32 to create the electrical insulation between the vertical PIN diode 30 and the other component of the same MMIC.

Figure 11:
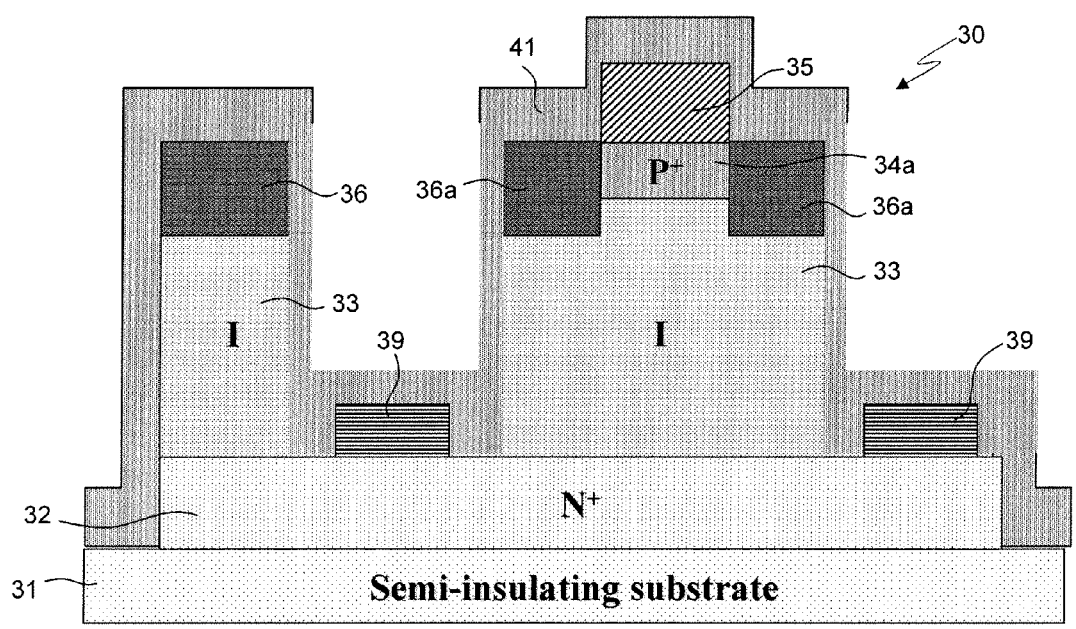

Subsequently, as shown in FIG. 11, a passivation layer 41 composed of a dielectric layer, for example $Si_3N_4$ and/or $SiO_2$, can be deposited to protect the surface of the semiconductor.

Subsequently, as is generally carried out for the manufacture of MMIC devices, and amply documented as known art, work proceeds by creating the tracks, interconnections, bump contacts, metal bridges and connections with the back metallization via holes made in the substrate, which can contribute to the integrated and monolithic creation of circuits based on PIN diodes and other components, such as inductors, condensers, resistors and other passive components.

Figure 12:
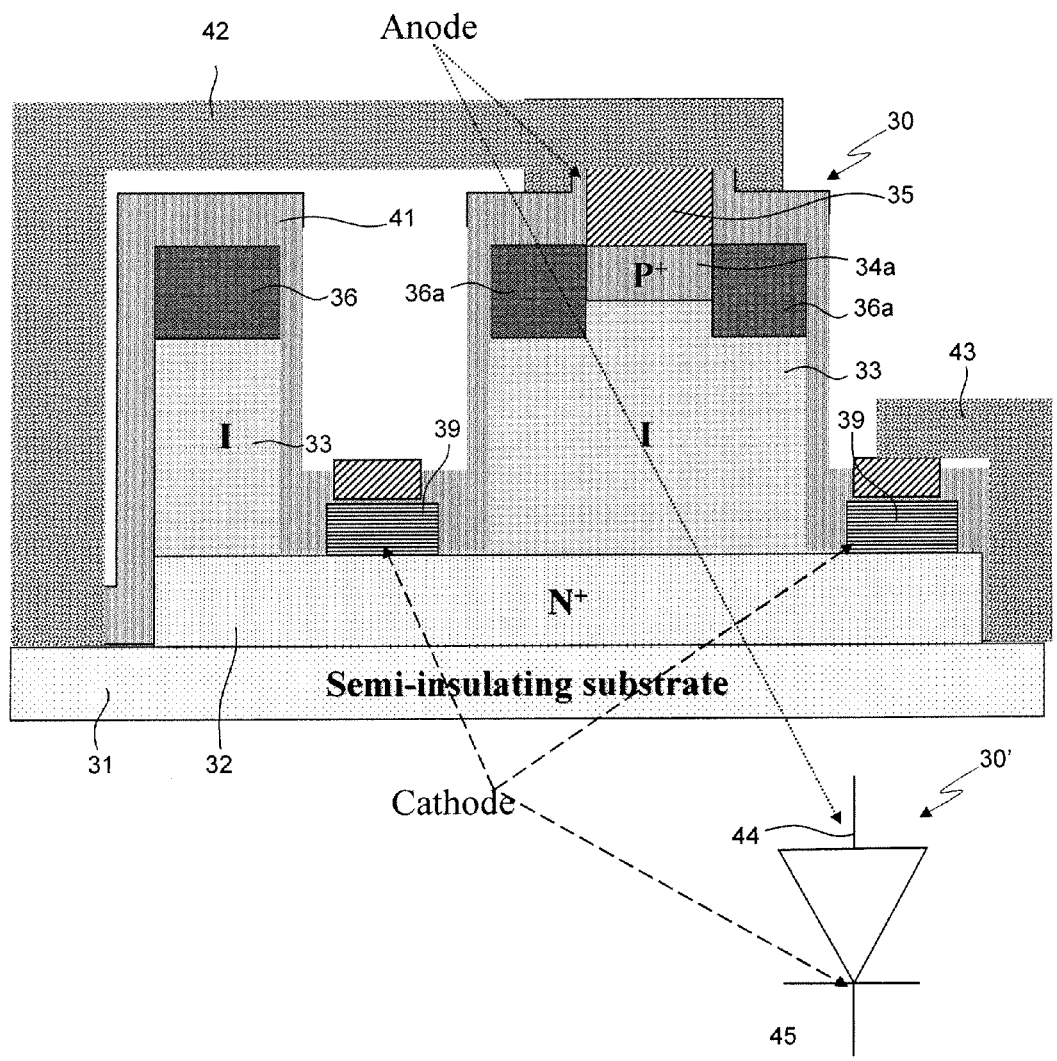

Preferably, with reference to FIG. 12, connections by metal bridges, like those indicated in FIG. 12 with reference numerals 42 and 43, which respectively connect the anode contact and the cathode contact to the rest of the components and tracks preset on the same MMIC, are made by depositing Gold (Au) and subsequent galvanic growth of the deposited gold.

Regarding anode contact connection by metal bridges, the present invention permits facilitating manufacture even when making contacts of submicrometric dimensions, as it is possible to rest the metal bridge on the passivation layer 41 deposited on top of the side-guard ring 36a, which can have larger dimensions than the anode region 34a, similar to that shown in FIG. 12, thus contributing to a further reduction in parasitic capacitances.

In addition, FIG. 12 also shows a circuit symbol 30' of the diode 30 that comprises an anode terminal 44 and a cathode terminal 45.

In particular, as shown in FIG. 12, the anode terminal 44 of the circuit symbol 30' corresponds to the anode metallization 35 of the diode 30, while the cathode terminal 45 of the circuit symbol 30' corresponds to the cathode metallization 39 of the diode 30.

The advantages of the present invention can be immediately understood from the preceding description.

In particular, it is wished to underline how the method of manufacturing vertical PIN diodes according to the present invention is different from known manufacturing processes, according to which dry etchings are made self-aligned with the anode contact for creating the cathode contact, making a compromise between etching anisotropy and mechanical damage to the surfaces of the lateral walls of the intrinsic layer I 33 present between the anode contact and the cathode contact.

Figure 1:
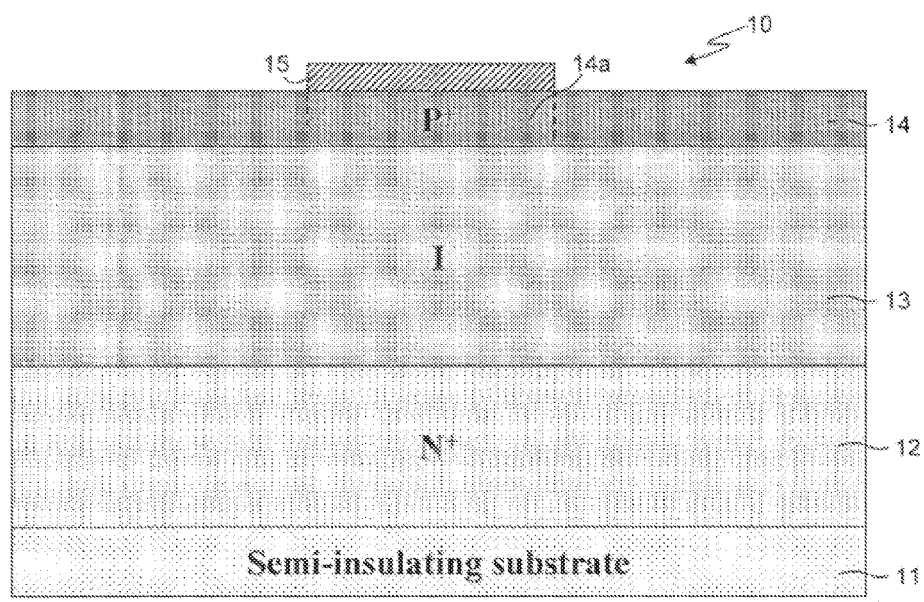
FIGS. 1-3 are schematic cross-sectional views of a vertical PIN diode manufactured according to a known manufacturing process.

In fact, according to the present invention, the first vertical trench 38 for forming the cathode contact is made by etching that acts on portions of the electrically insulating layer 36 laterally spaced apart from the anode region 34a and that consequently do not cause lateral shrinkage of the anode contact, thus limiting the negative effects resulting from mechanical damage to the lateral surfaces of the anode region 34a. As previously stated, this mechanical damage to the lateral surfaces of the anode region and the underlying intrinsic layer is, instead, present in vertical PIN diodes made using known manufacturing processes, such as, for example, the method of manufacturing described in the previously cited article "MONOLITHIC MBE GaAs PIN DIODE LIMITER". In particular, FIGS. 1-b to 1-f of said article clearly demonstrate how etching carried out to expose the portion of the N⁺-type layer defining the cathode region also removes lateral portions of the P⁺-type layer defining the anode region and of the intrinsic layer I beneath said anode region, with consequent mechanical damage to the respective lateral surfaces. In this regard, it is important to underline the fact that even the method described in U.S. Pat. No. 5,213,994 is affected by the above-stated technical drawback. In fact, this technical drawback, although neither described nor shown in U.S. Pat. No. 5,213,994, must necessarily be present as according to U.S. Pat. No. 5,213,994 the etching destined to form the first trench in the P⁺ and N⁻ type layers is carried out without protecting in any way whatsoever the lateral surfaces of the portion of the P⁺-type layer defining the anode region and of the portion of the N⁻-type layer beneath said anode region.

Furthermore, the possibility provided by the present invention of using etching with more isotropic characteristics, for example based on immersion in a wet solution (for example, composed of one part $H_2SO_4$, one part $H_2O_2$ and twelve parts $H_2O$), for forming the cathode contact, without this affecting the junction area of the diode, provides better chances of mitigating the formation of electron "trap" states on the surface of the semiconductor.

Concerning the first aspect, the advantage of the present invention is represented by the fact of being able to limit the area of the anode contact to much smaller dimensions thanks to the fact of using the anode metallization 35 as a mask for the ion implantation, so as to minimize, in a reproducible manner, both parasitic capacitances and parasitic resistances. In the present invention, this reproducibility is guaranteed, avoiding the risk of process tolerances of the first etching having repercussions in an uncontrolled reduction of the anode contact.

The other main technical advantage of the present invention is, therefore, represented by the fact that the vertical PIN diodes made according to the present invention have very low leakage currents when directly or inversely polarized.

The vertical PIN diodes made according to the present invention therefore mitigate the problems related to the presence of residual deposits and/or mechanical damage, which can nullify both the performance and the reliability of PIN devices.

Finally, it is understood that various modifications may be made to the present invention without departing from the scope of protection of the invention defined in the appended claims.

The invention claimed is:

1. Method of manufacturing a vertical Positive-Intrinsic-Negative (PIN) diode (30), comprising:
   providing an epitaxial wafer comprising a vertically stacked N-type layer (32), an intrinsic layer (33) and a P-type layer (34); and
   forming an anode contact of the vertical Positive-Intrinsic-Negative (PIN) diode (30) by forming an anode metallization (35) on a first portion (34a) of the P-type layer (34) defining an anode region;
characterized by further comprising:
   forming an electrically insulating layer (36) around the anode region (34a) such that a first portion of the intrinsic layer (33) extends vertically between the N-type layer (32) and the anode region (34a) and second portions of the intrinsic layer (33) extend vertically between the N-type layer (32) and the electrically insulating layer (36);
   forming a trench (38) in the electrically insulating layer (36) and in the second portions of the intrinsic layer (33) so as to expose a portion of the N-type layer (32) defining a cathode region and to define a sacrificial side-guard ring (36a) constituted by a portion of the electrically insulating layer (36) that extends laterally between the trench (38) and the anode region (34a) and laterally surrounds said anode region (34a); and
   forming a cathode contact of the vertical Positive-Intrinsic-Negative (PIN) diode (30) by forming a cathode metallization (39) on the exposed portion of the N-type layer (32) defining the cathode region;
   wherein forming the electrically insulating layer (36) comprises:
   carrying out the ion implantation in a second portion of the P-type layer (34), which is distinct from the first portion (34a) of the P-type layer (34) defining the anode region (34a) and which laterally surrounds said anode region (34a).

2. The method of claim 1, wherein carrying out the ion implantation in a second portion of the P-type layer (34) comprises:
   selectively implanting ions in the second portion of the P-type layer (34) to make it electrically insulating, said electrically insulating layer (36) comprising said second portion of the P-type layer (34) in which the ions have been selectively implanted.

3. The method of claim 2, wherein the ions selectively implanted in the second portion of the P-type layer (34) damage a crystal lattice of the second portion of the P-type layer (34) so as to render said second portion of the P-type layer (34) electrically insulating.

4. The method according to claim 1, wherein the ion implantation is carried out self-aligned with the anode metallization (35).

5. The method according to claim 1, wherein the ion implantation is carried out using a first mask formed on the vertical Positive-Intrinsic-Negative (PIN) diode (30) so as to expose the second portion of the P-type layer (34) to ion implantation.

6. The method according to claim 1, wherein forming the trench (38) comprises:
   selectively removing a first portion (36b) of the electrically insulating layer (36) and the second portions of the intrinsic layer (33) that extend beneath said first portion (36b) of the electrically insulating layer (36) so as to expose the portion of the N-type layer (32) defining the cathode region, said first portion (36b) of the electrically insulating layer (36) being laterally spaced apart from the anode region (34a) such that a second portion (36a) of the electrically insulating layer (36) defining the sacrificial side-guard ring (36a) extends laterally between the first portion (36b) of the electrically insulating layer (36) and the anode region (34a) and laterally surrounds said anode region (34a), said first portion (36b) of the electrically insulating layer (36) laterally surrounding said second portion (36a) of the electrically insulating layer (36).

7. The method of claim 6, wherein selectively removing the first portion (36b) of the electrically insulating layer (36) and the second portions of the intrinsic layer (33) that extend beneath said first portion (36b) of the electrically insulating layer (36) comprises:
   carrying out a wet etching so as to remove said first portion (36b) of the electrically insulating layer (36) and the second portions of the intrinsic layer (33) that extend beneath said first portion (36b) of the electrically insulating layer (36).

8. The method of claim 7, wherein the wet etching is carried out using a second mask formed on the vertical Positive-Intrinsic-Negative (PIN) diode (30) so as to expose said first portion (36b) of the electrically insulating layer (36) to said wet etching.

* * * * *